US011101170B2

(12) United States Patent
Ichihashi et al.

(10) Patent No.: US 11,101,170 B2
(45) Date of Patent: Aug. 24, 2021

(54) DUAL AIRGAP STRUCTURE

(71) Applicant: GLOBALFOUNDRIES U.S. INC., Santa Clara, CA (US)

(72) Inventors: Motoi Ichihashi, Sunnyvale, CA (US); Atsushi Ogino, Fishkill, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 159 days.

(21) Appl. No.: 16/509,947

(22) Filed: Jul. 12, 2019

(65) Prior Publication Data

US 2019/0333801 A1 Oct. 31, 2019

Related U.S. Application Data

(62) Division of application No. 15/901,411, filed on Feb. 21, 2018, now Pat. No. 10,395,980.

(51) Int. Cl.
*H01L 21/02* (2006.01)
*H01L 21/768* (2006.01)
*H01L 23/522* (2006.01)
*H01L 23/532* (2006.01)

(52) U.S. Cl.
CPC .... *H01L 21/7682* (2013.01); *H01L 21/76877* (2013.01); *H01L 23/5226* (2013.01); *H01L 23/5329* (2013.01); *H01L 23/53228* (2013.01); *H01L 23/53242* (2013.01)

(58) Field of Classification Search
CPC ........... H01L 23/5329; H01L 23/53242; H01L 23/5226; H01L 21/7682; H01L 21/76877
See application file for complete search history.

(56) References Cited

U.S. PATENT DOCUMENTS

| | | | |
|---|---|---|---|
| 6,287,979 B1 | 9/2001 | Zhou | |
| 6,413,852 B1 | 7/2002 | Grill et al. | |
| 6,509,623 B2 | 1/2003 | Zhao | |
| 7,135,402 B2 | 11/2006 | Lin et al. | |
| 7,361,991 B2 | 4/2008 | Saenger et al. | |
| 7,449,407 B2 | 11/2008 | Lur et al. | |
| 7,749,891 B2 | 7/2010 | Ueda | |
| 8,120,179 B2 | 2/2012 | Chanda et al. | |
| 8,241,992 B2 | 8/2012 | Clevenger et al. | |
| 8,456,009 B2 | 6/2013 | Su et al. | |
| 8,586,447 B2 | 11/2013 | Noguchi et al. | |
| 8,642,252 B2 | 2/2014 | Clevenger et al. | |
| 9,385,028 B2 | 7/2016 | Nemani et al. | |
| 9,780,027 B2 | 10/2017 | Bergendahl et al. | |

(Continued)

OTHER PUBLICATIONS

K. Fischer et al, "Low-k Interconnect Stack with multi-layer Air Gap and Tri-Metal-Insulator-Metal Capacitors for 14nm High Volume Manufacturing", vol. 978-1-4673-7356-2/15 © 2015 IEEE, 4 pages.

(Continued)

*Primary Examiner* — Hoa B Trinh
(74) *Attorney, Agent, or Firm* — Anthony Canale; Andrew Calderon; Roberts Calderon Safran & Cole, P.C.

(57) ABSTRACT

The present disclosure relates to semiconductor structures and, more particularly, to a dual airgap structure and methods of manufacture. The structure includes: a lower metal line; a plurality of upper metal lines; and a first airgap between the lower metal line and at least one upper metal line of the plurality of upper metal lines.

16 Claims, 15 Drawing Sheets

(56) References Cited

U.S. PATENT DOCUMENTS

| | | | |
|---|---|---|---|
| 9,991,200 B2* | 6/2018 | Ting | H01L 21/76831 |
| 2004/0229454 A1 | 11/2004 | Torres et al. | |
| 2004/0232552 A1 | 11/2004 | Wang et al. | |
| 2008/0026541 A1 | 1/2008 | Edelstein et al. | |
| 2009/0072409 A1 | 3/2009 | Nitta et al. | |
| 2009/0091038 A1 | 4/2009 | Chen et al. | |
| 2009/0121356 A1 | 5/2009 | Nakagawa | |
| 2011/0198757 A1* | 8/2011 | Su | H01L 21/76805 257/764 |
| 2014/0191401 A1 | 7/2014 | Fischer | |
| 2017/0170184 A1 | 6/2017 | Nguyen et al. | |

OTHER PUBLICATIONS

S. Natarajan et al, "A 14nm Logic Technology Featuring 2nd Generation FinFET Transistors, Air-Gapped Interconnects, Self-Aligned Double Patterning and a 0.00588um 2 SRAM cell size", vol. 978-1-4799-8001-7/14, 2014 IEEE, 3 pages.

Serkan Kincal et al,"RC Performance Evaluation of Interconnect Architecture Options Beyond the 10-nm Logic Node", IEEE Transactions on Electron Devices, vol. 61, No. 6, Jun. 2014, 6 pages.

* cited by examiner

DUAL AIRGAP STRUCTURE

FIELD OF THE INVENTION

The present disclosure relates to semiconductor structures and, more particularly, to a dual airgap structure and methods of manufacture.

BACKGROUND

Signal delay in metal interconnect structures depends on a time constant known as a resistance-capacitance (RC) delay, which is the product of the resistance of a metal line, which electrical current flows and the capacitance between the metal line and neighboring conductive structures. The capacitance is proportional to the effective dielectric constant of the dielectric materials between the metal line and the neighboring conductive structures and the effective area of the capacitive structure including the metal line. Moreover, the capacitance is inversely proportional to the effective distance between the metal line and the neighboring conductive structures.

The effective area of the capacitive structure and the effective distance between the metal line are geometrical factors that depend on the design of a metal interconnect structure. The effective dielectric constant can be decreased by having materials with a low dielectric constant. For example, materials having a low dielectric constant (low-k) materials (i.e., dielectric constant less than about 4) can be used in semiconductor chips. However, parasitic capacitance is still a challenge in future designs as it is harder to reduce the parasitic capacitance per bit line of a static random access memory (SRAM) as chip manufacturing technology improves.

SUMMARY

In an aspect of the disclosure, a structure comprises: a lower metal line; a plurality of upper metal lines; and a first airgap between the lower metal line and at least one upper metal line of the plurality of upper metal lines.

In an aspect of the disclosure, a method comprising: forming a lower metal line within dielectric material; forming a first material above the lower metal line; forming an upper dielectric material over the first material; forming a plurality of upper metal lines over the upper dielectric material; etching the upper dielectric material to expose the first material; removing the first material to form a first airgap above the lower metal line; and forming another dielectric material between each of the plurality of upper metal lines to seal the first airgap.

In an aspect of the disclosure, a method comprises: forming a lower metal line within dielectric material; forming a first material on the lower metal line; forming a second material over the dielectric material; forming an upper dielectric material over the first material and the second material; forming a plurality of upper metal lines over the upper dielectric material; removing portions of the upper dielectric material to expose the first material and the second material; and removing the first material to form a first airgap while the second material protects the dielectric material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a dual airgap structure and methods of manufacture. More specifically, the dual airgap structure includes airgaps in both the horizontal and vertical direction, which reduces overlapping interconnect capacitance. Advantageously, the dual airgap structure of the present disclosure has lower power consumption, lower parasitic capacitance, and faster performance than conventional semiconductor structures.

The dual airgap structure of the present disclosure can be manufactured in a number of ways using a number of different tools. In general, though, the methodologies and tools are used to form structures with dimensions in the micrometer and nanometer scale. The methodologies, i.e., technologies, employed to manufacture the dual airgap structure of the present disclosure have been adopted from integrated circuit (IC) technology. For example, the structures are built on wafers and are realized in films of material patterned by photolithographic processes on the top of a wafer. In particular, the fabrication of the dual airgap structure uses three basic building blocks: (i) deposition of thin films of material on a substrate, (ii) applying a patterned mask on top of the films by photolithographic imaging, and (iii) etching the films selectively to the mask.

Figure 1:
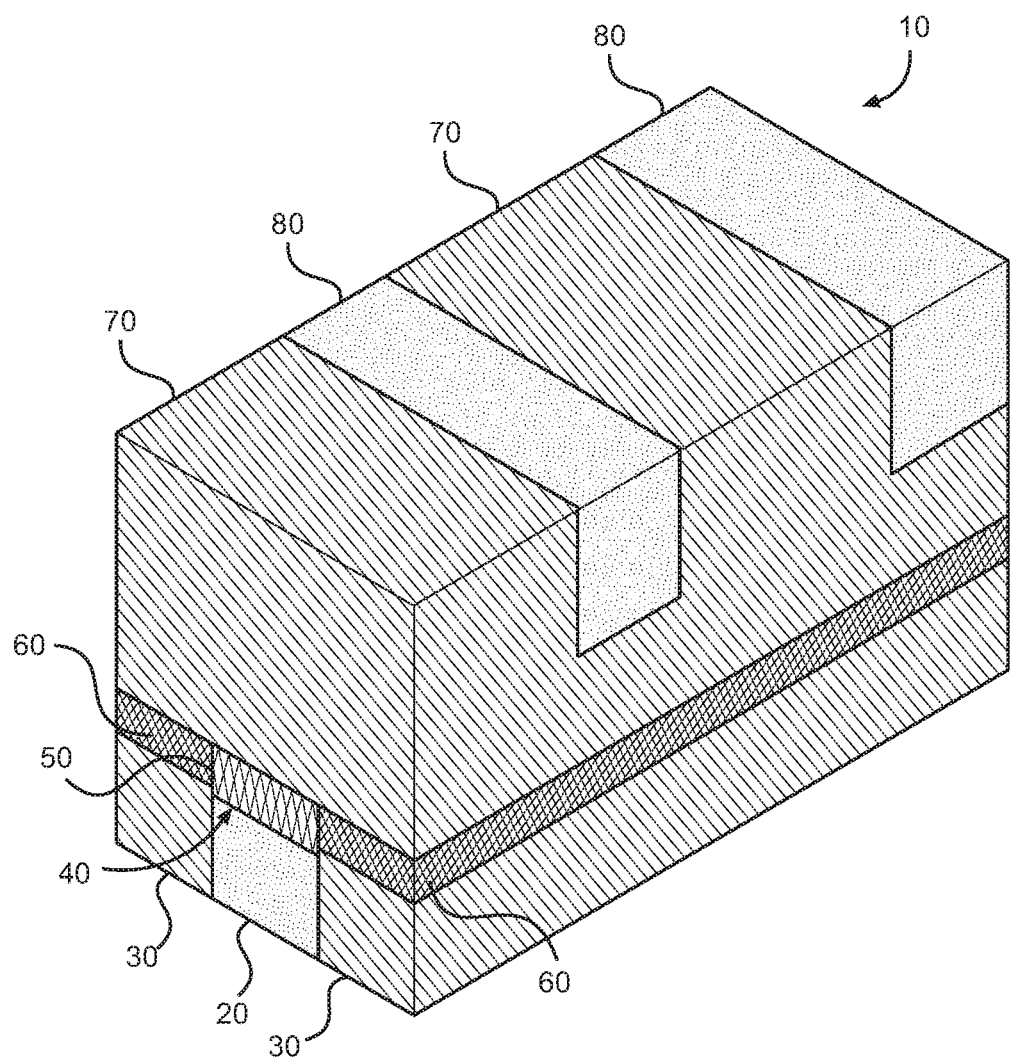
FIG. 1 shows a semiconductor structure and respective fabrication processes in accordance with aspects of the present disclosure.

FIG. 1 shows a semiconductor structure and respective fabrication processes in accordance with aspects of the present disclosure. More specifically, the structure 10 of FIG. 1 includes a lower metal line 20 on a lower metal layer of the structure, within insulator material 30 (dielectric material). In embodiments, the lower metal line 20 can be fabricated using any conventional CMOS technology, i.e., conventional lithography, etching and deposition methods known to those of skill in the ar. For example, a resist formed over the insulator material 30 is exposed to energy (light) to form a pattern (opening). An etching process with a selective chemistry, e.g., reactive ion etching (RIE), will be used to form one or more trenches in the insulator material 30 through the openings of the resist. The resist can then be removed by a conventional oxygen ashing process or other known stripants. Following the resist removal, conductive material, e.g., copper or ruthenium, can be deposited by any conventional deposition processes, e.g., chemical vapor deposition (CVD) processes. Any residual material on the surface of the insulator material 30 can be removed by conventional chemical mechanical polishing (CMP) processes.

Still referring to FIG. 1, the lower metal line 20 is recessed using an etching process, selective to the material of the lower metal line 20. In embodiments, the recess 40 can be about 10 nm to about 20 nm in depth; although other dimensions are contemplated herein. A material 50 is deposited within the recess 40 by a conventional CVD process. In embodiments, the material 50 is different from the material of the lower metal line 20 so that it can be selectively removed in later processes. For example, the material 50 can be, e.g., oxide material. In embodiments, the material 50 can be patterned to be confined with the recess, and, in embodiments, partially above the recess.

A capping material 60 is deposited over the dielectric material 30, followed by a CMP process to planarize the material 50 and the capping material 60. In embodiments, the capping material 60 and the material 50 can have a thickness in the range of about 10 nm to about 20 nm; although other dimensions are contemplated herein. The capping material 60 can be, e.g., SiN, SiCN, oxynitride, aluminum or other material that prevents metal migration into upper layers of the structure. In further embodiments, the capping material 60 will also act as an etch stop layer in subsequent etching processes. In any scenario, the capping material 60 and the material 50 are composed of different materials to allow for selective etching of the material 50 in later processing steps.

In alternate embodiments, the capping material 60 can first be deposited over the dielectric material 30 and the metal line 20, followed by a patterning process over the metal line 20. During this patterning process, the metal line 20 can be recessed by a selective etching process. In this etching step, the capping material 60 can act as an etch stop layer. The material 50 can then be deposited within the recess of the metal line, followed by a CMP of both the capping material 60 and the material 50.

FIG. 1 further shows the deposition of an upper insulator material, e.g., an upper dielectric material 70. In embodiments, the upper dielectric material 70 can be deposited by a conventional deposition process, e.g., CVD. Metal lines 80 are formed within the upper dielectric material 70. For example, much like the fabrication process of the lower metal line 20, a resist formed over the insulator material 70 is exposed to energy (light) to form a pattern (opening). An etching process with a selective chemistry, e.g., RIE, will be used to form one or more trenches in the upper insulator material 70 through the openings of the resist. Following the resist removal, conductive material, e.g., copper or ruthenium, can be deposited by any conventional deposition processes, e.g., CVD processes, within the trenches. Any residual material on the surface of the upper insulator material 70 can be removed by conventional chemical mechanical polishing (CMP) processes. In embodiments, the conductive material (e.g., copper or ruthenium) is can be orthogonal to the lower metal line 20; although different patterning schemes are also contemplated herein.

In embodiments, the upper metal lines 80 can be composed of copper or other conductive material (e.g., ruthenium), with a pitch of about 40 nm to allow for formation of an airgap therebetween in subsequent deposition processes. It should be understood that other dimensions are also contemplated herein.

Figure 2:
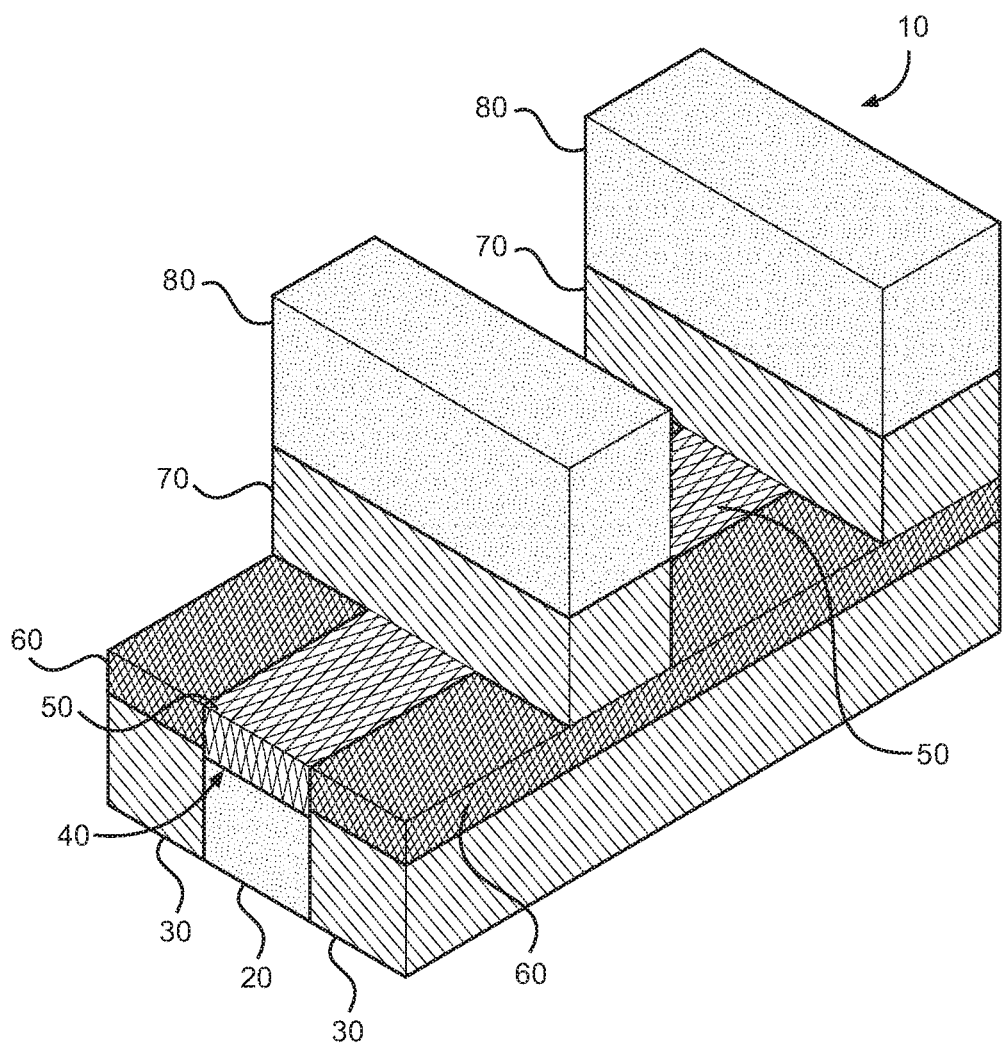
FIG. 2 shows an exposed material on a lower metal wiring line, amongst other features, and respective fabrication processes in accordance with aspects of the present disclosure.

In FIG. 2, portions of the upper dielectric material 70 are removed to expose the material 50 and the capping material 60. In embodiments, the upper dielectric material 70 can be removed by conventional etching processes, i.e., anisotropic etching processes. In this way, the upper dielectric material 70 will remain under the upper metal lines 80. Also, in embodiments, the capping material 60 will protect the underlying dielectric material 30 during this etching process.

Figure 3:
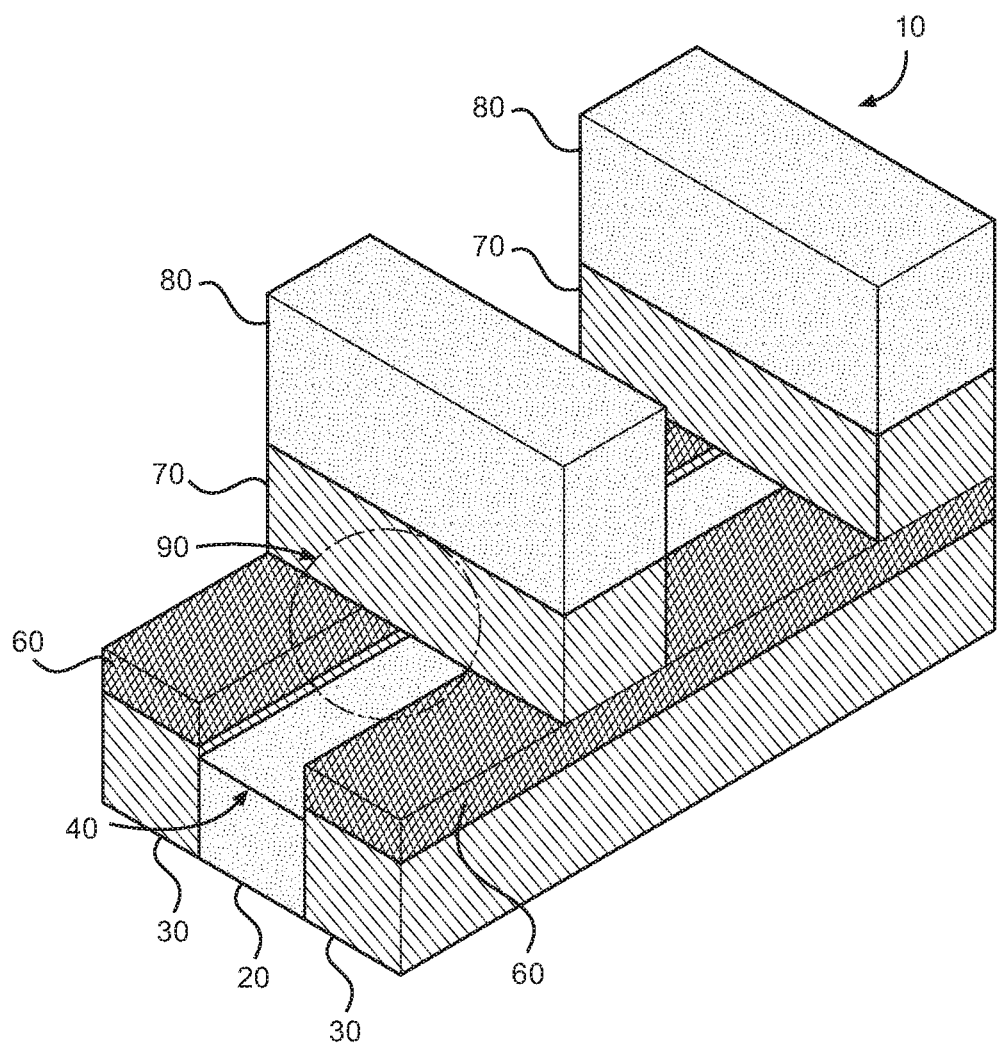
FIG. 3 shows an airgap under an upper metal line, amongst other features, and respective fabrication processes in accordance with aspects of the present disclosure.

As shown in FIG. 3, a recess 90 is formed under the upper dielectric material 70 and, more particularly, over the lower metal line 20 and under the upper metal lines 80. In embodiments, the recess 90 is formed by removal of the material 50 under the upper dielectric material 70 by a selective etching process. In embodiments, the selective etching process can be, e.g., an isotropic wet etching process, which does not require any additional masking steps. This is due to the material 50 being different than the capping material 60. Also, in embodiments, the capping material 60 will protect the underlying dielectric material 30 during this etching process.

Figure 4A:
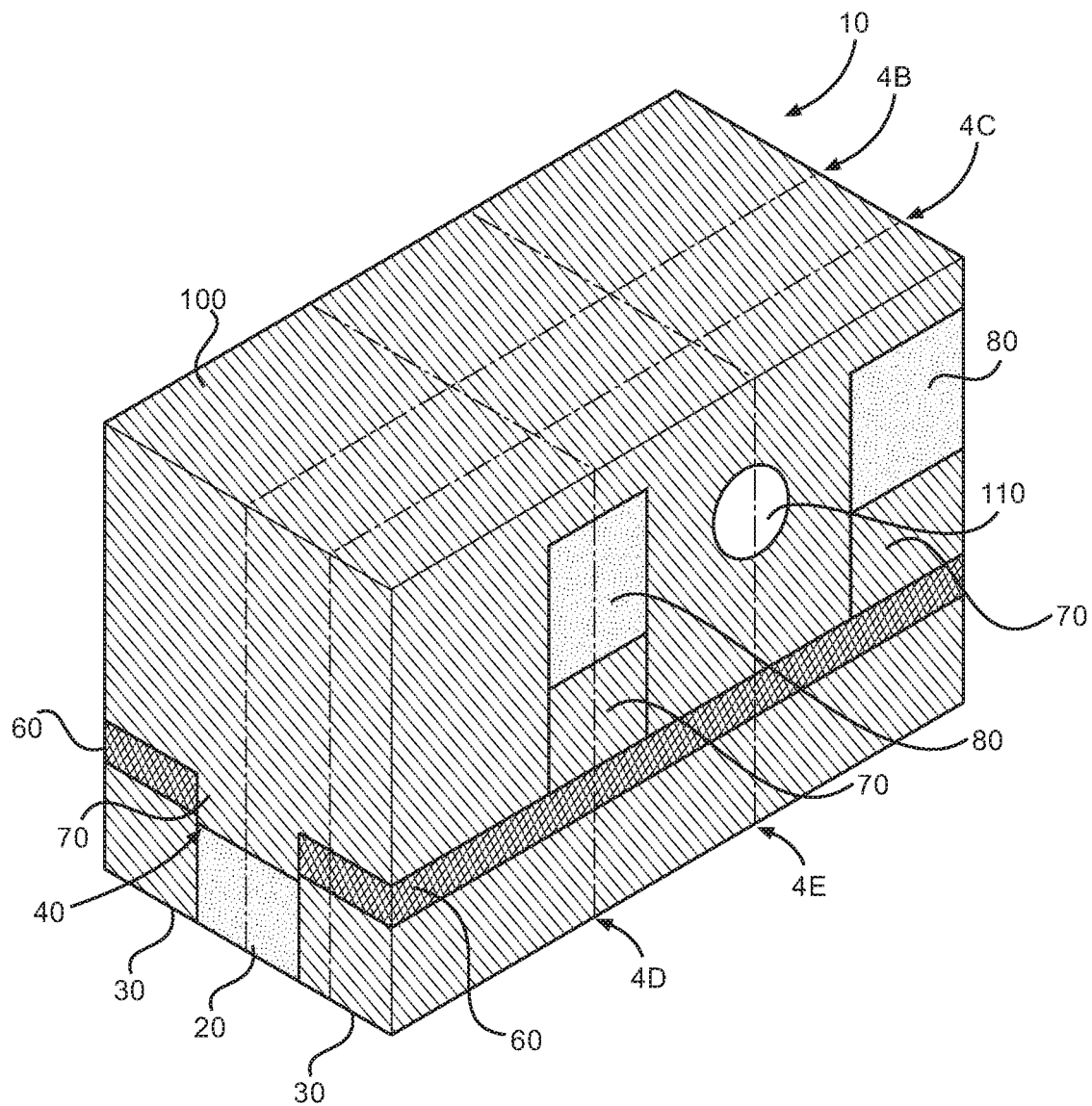
FIG. 4A shows a perspective view of the dual airgap structure, amongst other features, and respective fabrication processes in accordance with aspects of the present disclosure.
Figure 4B:
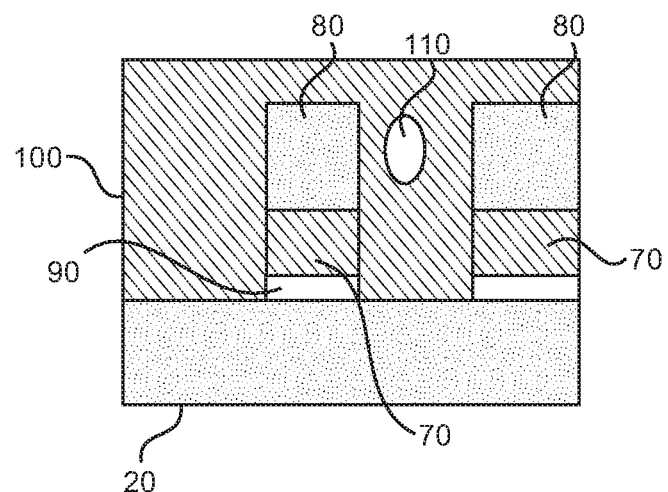
FIGS. 4B-4E show several cross sectional views of the structure of FIG. 4A and respective fabrication processes in accordance with aspects of the present disclosure.
Figure 4C:
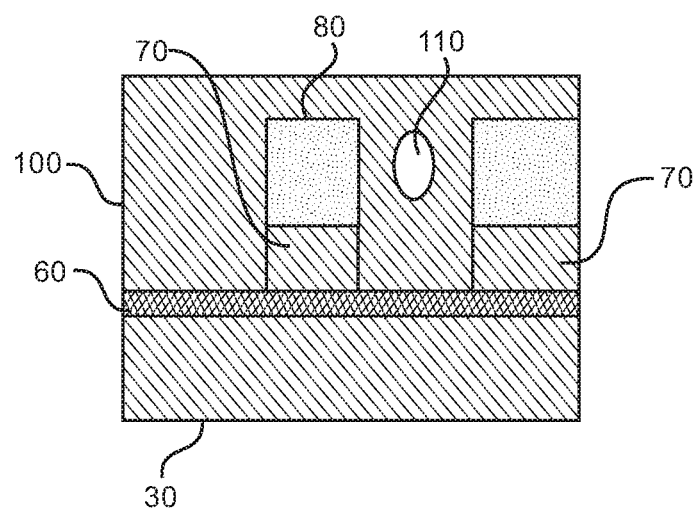
Figure 4D:
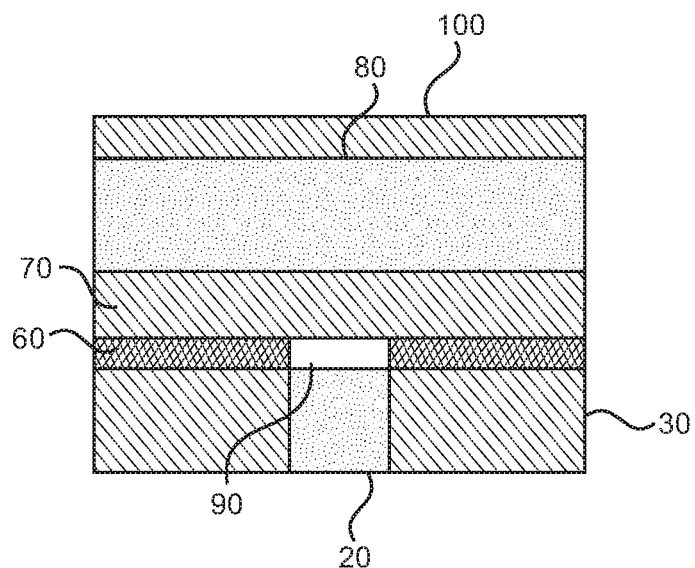
Figure 4E:
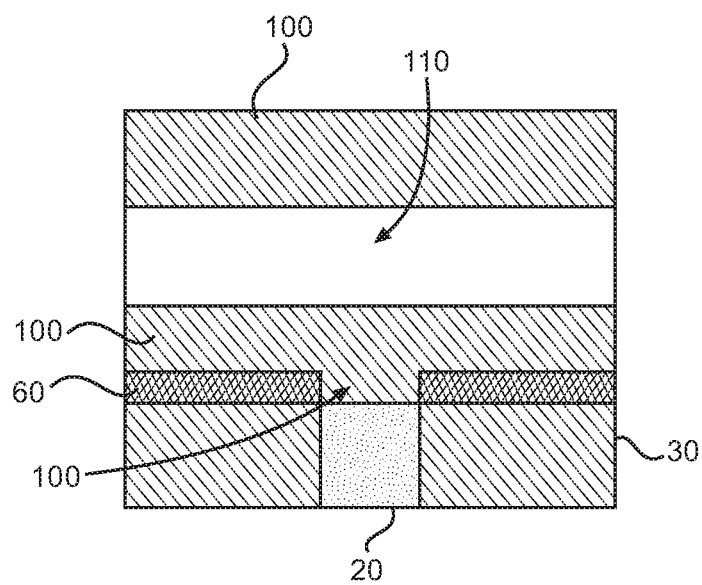

FIG. 4A shows a perspective view of the dual airgap structure, amongst other features, and respective fabrication processes in accordance with aspects of the present disclosure; whereas, FIGS. 4B-4E show several cross sectional views of the structure of FIG. 4A. In particular, FIGS. 4B-4E each correspond to cross sectional lines 4B, 4C, 4D, 4E shown in FIG. 4A. As shown in these views, an upper dielectric material 70 deposited over the capping material 60 and the recessed portion to form an airgap 90, away from under the upper metal lines 80. In embodiments, the upper dielectric material 70 is deposited using a conventional deposition process, e.g., CVD, which also results in airgaps 110 between the upper metal lines 80, formed by a pinch-off process. As shown in FIG. 4B, the airgap 90 is shown above the lower metal line 20 and below the upper dielectric material 70 and the airgaps 110 are between the upper metal lines 80, formed by a pinch-off process of the upper dielectric material 70. In FIG. 4C, the capping material 60 is shown above the dielectric material 30, with the upper dielectric material 70 above the capping material 60. Airgaps 110 are between the upper metal lines 80 and the upper dielectric material 70. FIG. 4D, the airgap 90 is shown to be above the lower metal line 20 and the upper dielectric material 70 is above the capping material 60 and the airgap 90. In FIG. 4E, the airgaps 110 is shown to be within the upper dielectric material 70.

Figure 5:
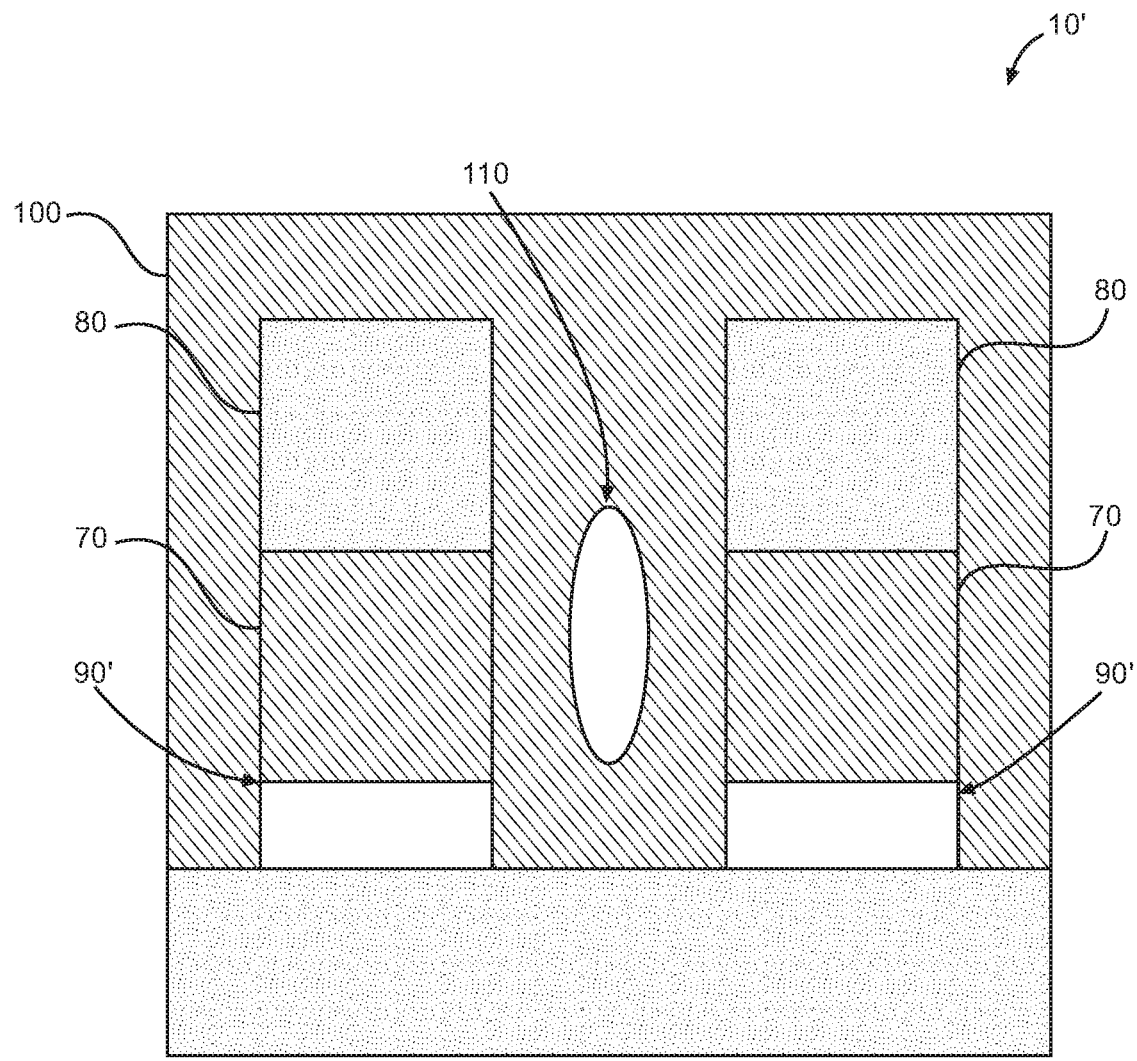
FIG. 5 shows a dual airgap semiconductor structure without a recessed portion, amongst other features, in accordance with aspects of the present disclosure.

FIG. 5 shows the dual airgap of the semiconductor structure without a recessed portion, amongst other features. In this embodiment, the structure 10' includes a lower metal line 20 without a recessed portion. As previously described, the metal line 20 can be fabricated using any conventional CMOS technology, i.e., conventional lithography, etching and deposition methods known to those of skill in the ar. A material 50 is deposited over the lower metal line 20, which is different from the metal line 20 so that it can be selectively removed in later processes. Following a patterning process of the material 50, a capping material 60 is deposited over the dielectric material 30. The deposition process is followed by a CMP process to planarize the capping material 60 and the material 50. The capping material 60 can be, e.g., SiN, SiCN, oxynitride, aluminum or other material that prevents metal migrations into upper layers of the structure, as well as acts as an etch stop material. In any scenario, the capping material 60 and the material 50 are different materials. It should be understood by those of skill in the art that the capping material 60 can be deposited and patterned, prior to the deposition of the material 50.

FIG. 5 further shows the deposition of an upper dielectric material 70. In embodiments, the upper dielectric material 70 can be deposited by a conventional deposition process, e.g., CVD. In a manner similar to that described, upper metal lines 80 are formed in the upper dielectric material 70. The upper dielectric material 70 is removed to expose the material 50 and the capping material 60, i.e., anisotropic etching processes. In this way, the upper dielectric material 70 will remain under the upper metal lines 80. An airgap 90' is formed under the upper dielectric material 70 and, more particularly, over the lower metal line 20 and under the upper metal lines 80. This is performed by removal of the material 50 by a selective etching process as described herein, followed by deposition of an upper dielectric material 100 over the lower metal line 20, in addition to the capping material 50 and upper metal lines 80, which will seal the airgap 90' and form the airgaps 110 between (e.g., on the sides) the upper metal lines 80 through a pinch-off process.

Figure 6:
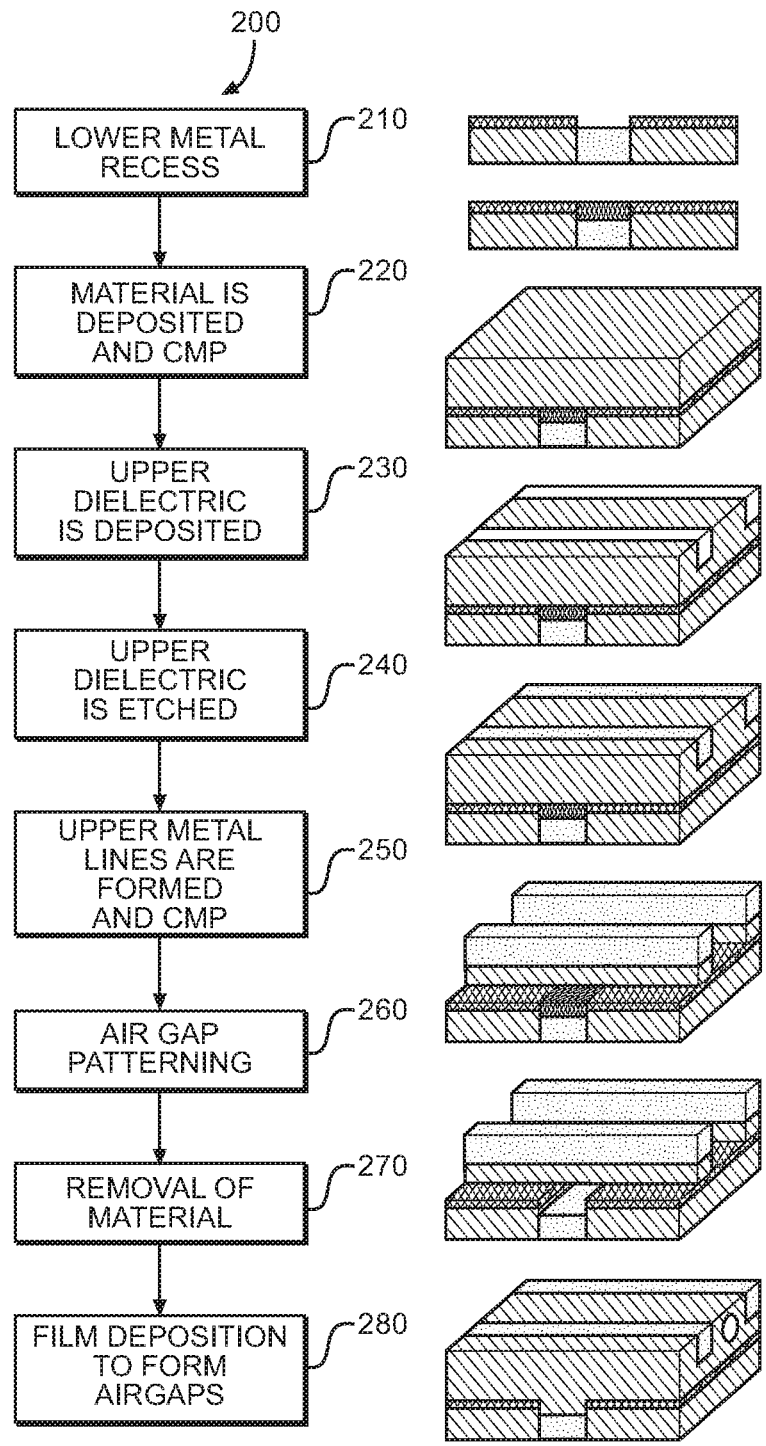
FIG. 6 shows a flowchart of processing steps for the fabricating the dual gap structure in accordance with aspects of the present disclosure.

FIG. 6 shows a flowchart 200 depicting the processing steps for the fabricating the dual gap structure in accordance with aspects of the present disclosure. At step 210, a lower metal line is recessed as already described herein. For example, the recess can be provided by a selective etching process to a depth of about 10 nm to about 20 nm; although other dimensions are completed herein. In step 220, a sacrificial material (e.g., material 50) is deposited within the recess by a conventional CVD process. In embodiments, the sacrificial material is different from the material of the lower metal line so that it can be selectively removed in later processing steps. In embodiments, the material can undergo a CMP process to planarize the material after deposition.

At step 230, an upper dielectric material can be deposited by a conventional CVD process, over the sacrificial material and the lower metal lines. At step 240, the upper dielectric material is patterned, e.g., etched, to form trenches. At step 250, metal material (e.g., copper or ruthenium) is deposited within the trenches to form upper metal lines within the upper dielectric material. This is followed by a CMP process to planarize the upper metal lines.

At step 260, portions of the upper dielectric material are removed to expose the sacrificial material over the lower metal line. At step 270, the sacrificial material is then removed above the lower metal lines, which forms a space (e.g., recess) over the lower metal lines and under the upper dielectric material. At step 280, a dielectric film (e.g., air gap film) can be deposited to form the airgap over the lower metal line and above and below the upper metal lines.

In the dual airgap structure shown in FIG. 5, the airgap 90' and airgap 110 can reduce parasitic capacitance. Further, when using the dual airgap structure in a logic design, power consumption can be lowered. Moreover, in static random access memory (SRAM), the dual airgap structure can result in a smaller capacitance per bit line and faster critical operations, compared to conventional systems. Therefore, the dual airgap structure of the present disclosure results in lower power consumption, lower parasitic capacitance, and faster critical operations than conventional semiconductor structures.

Example 1

Figure 7:
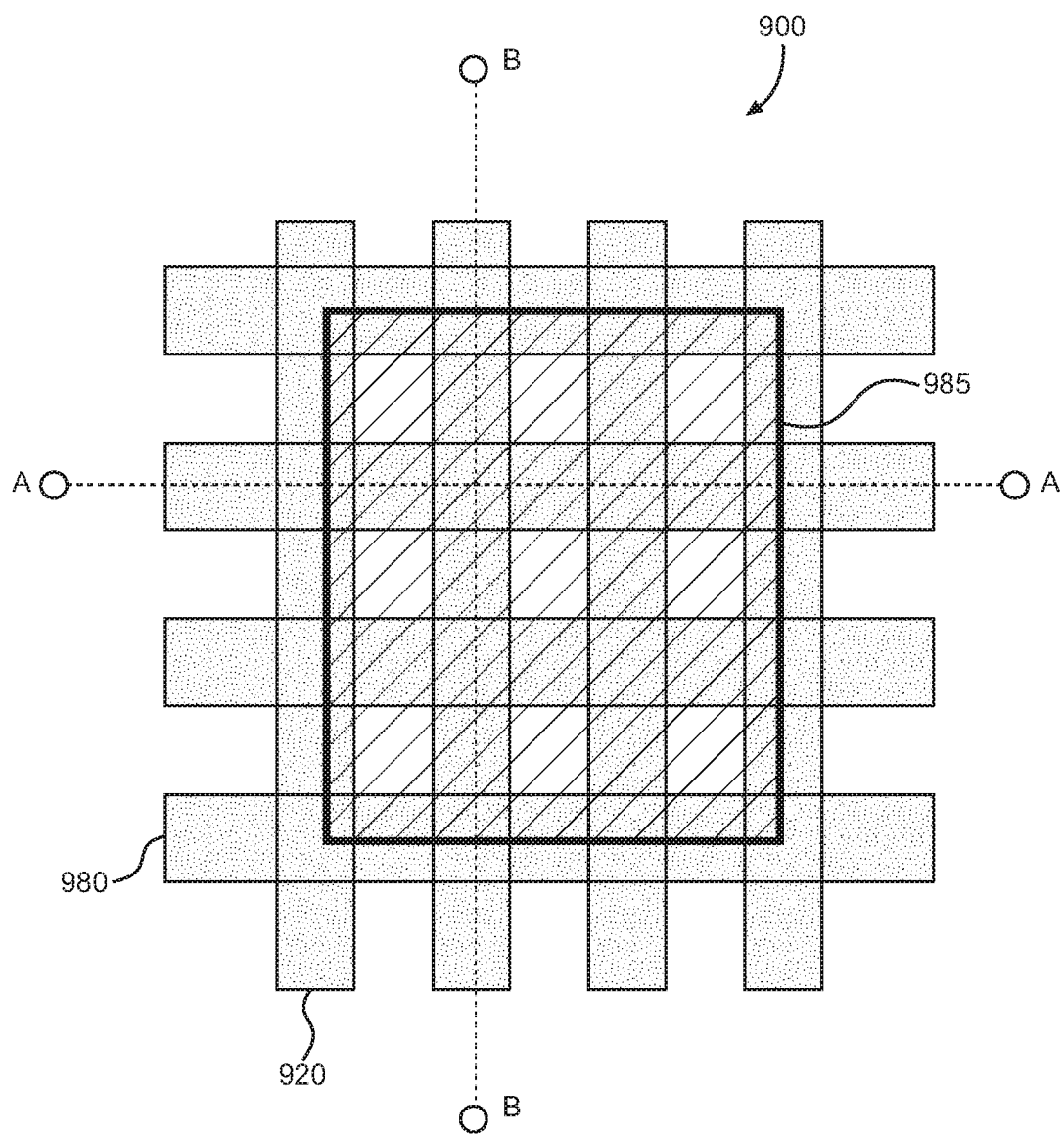
FIG. 7 shows a top down view of a generic semiconductor structure with air gap structure(s) in accordance with aspects of the present disclosure.

FIG. 7 shows a top down view of a generic semiconductor structure with air gap structure(s) in accordance with aspects of the present disclosure. It should be understood that FIG. 7 is a generic view of the different structures shown in FIGS. 7A-7N. More specifically, in FIG. 7, the structure 900 includes lower metal lines 920 and upper metal lines 980. A generic air gap structure 985 is shown overlapping portions of the lower metal lines 920 and the upper metal lines 980.

Figure 7A:
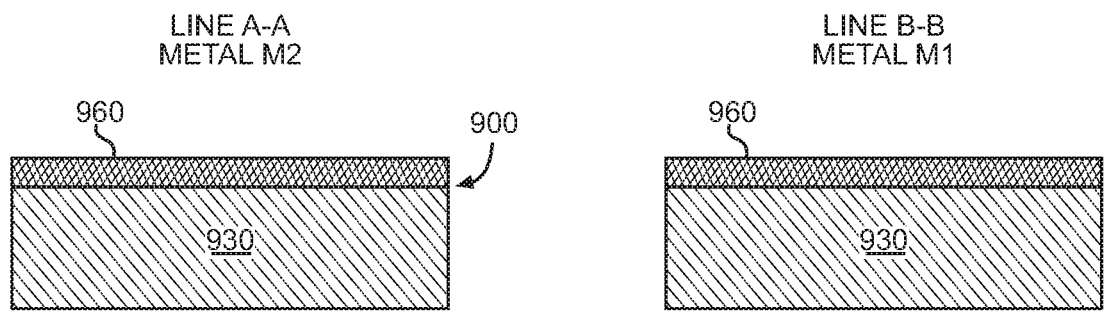
FIGS. 7A-7N show different cross-sectional views along line A-A and line B-B of FIG. 7, at different stages of fabrication, in accordance with aspects of the present disclosure.
Figure 7B:
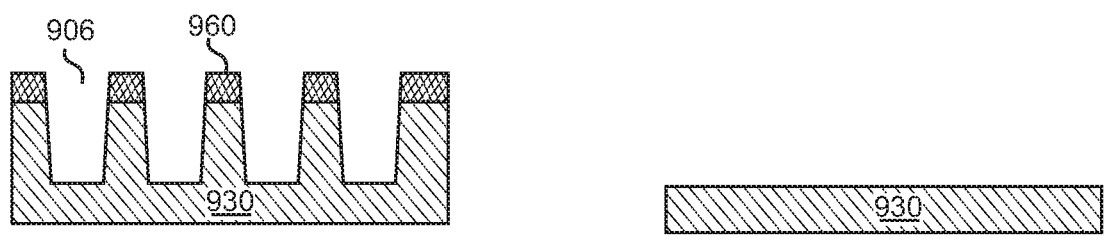
Figure 7C:
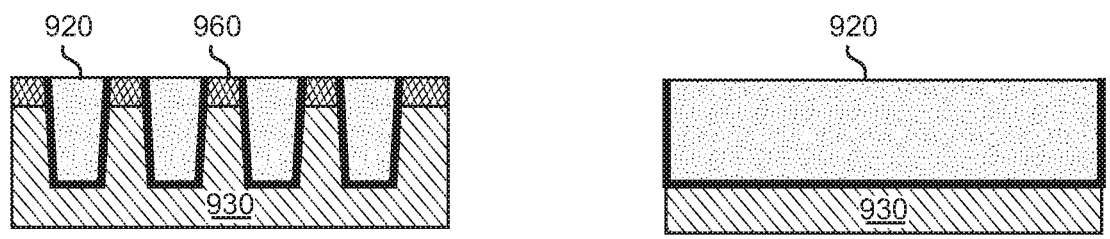
Figure 7D:
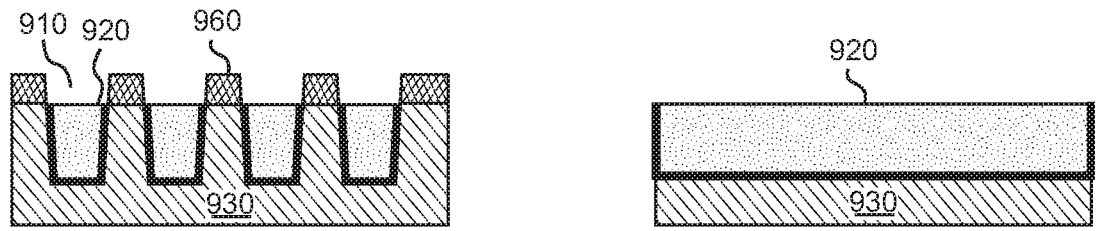
Figure 7E:
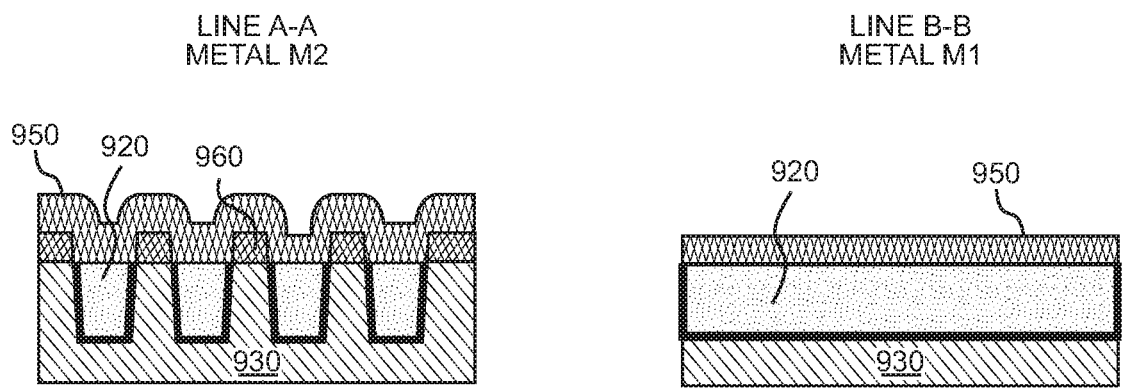
Figure 7F:
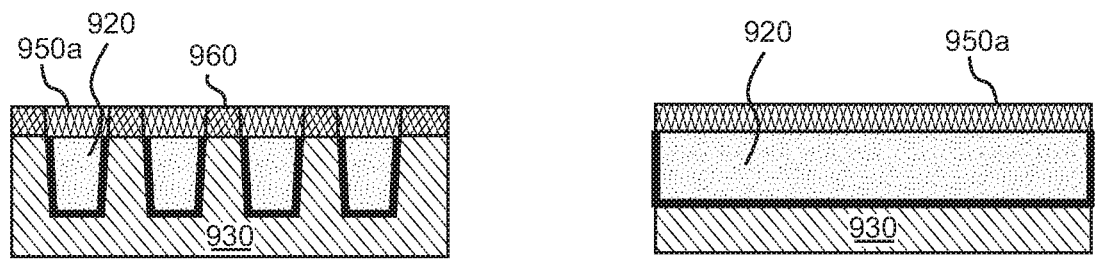
Figure 7G:
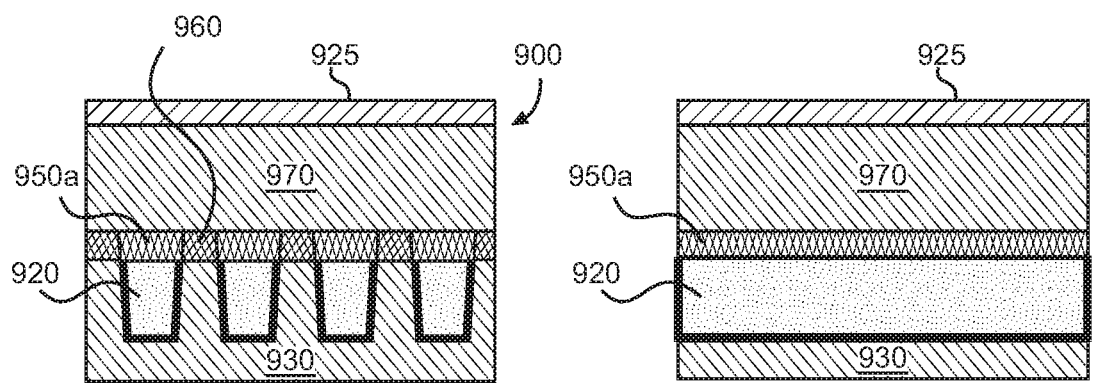
Figure 7H:
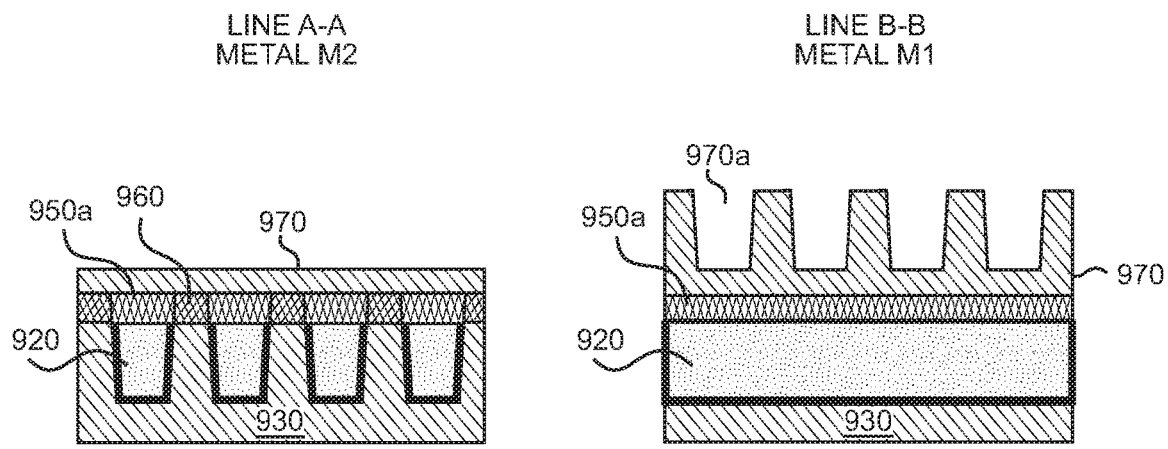
Figure 7I:
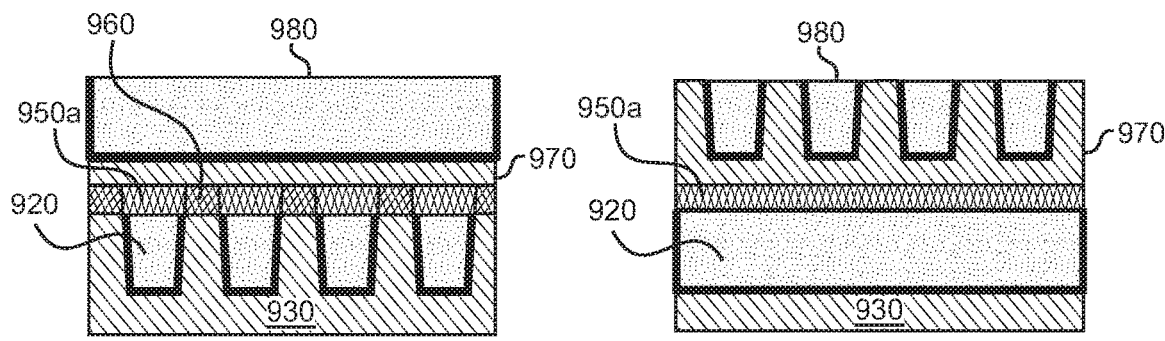
Figure 7J:
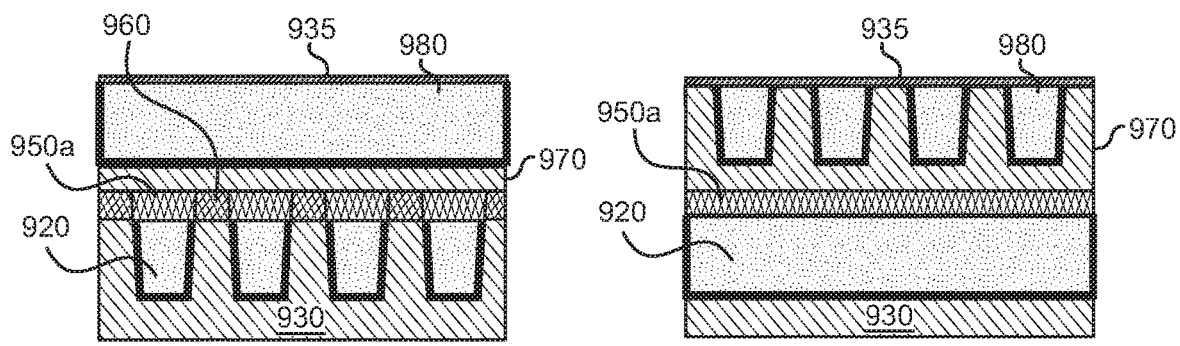
Figure 7K:
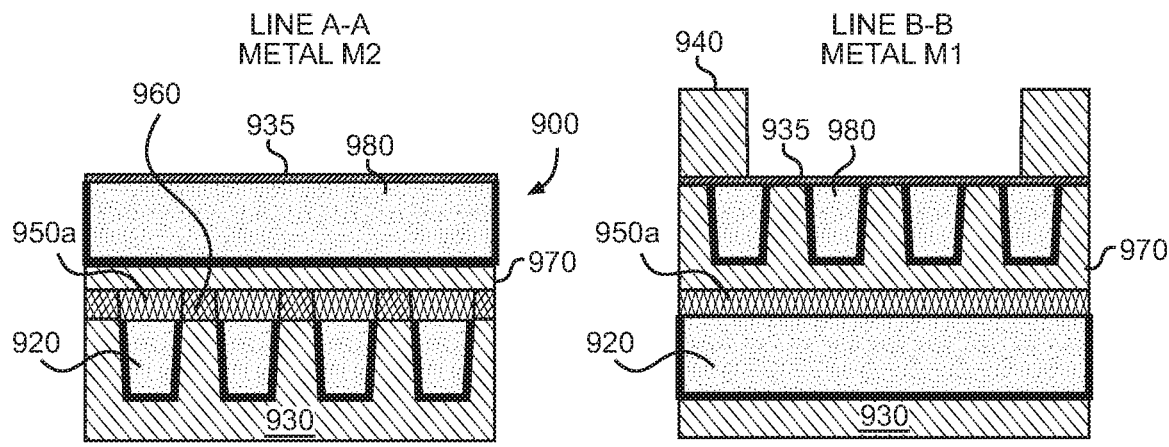
Figure 7L:
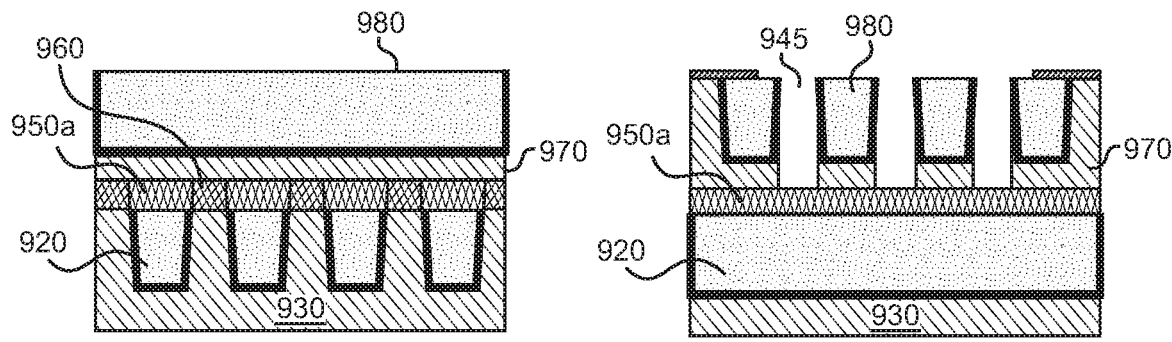
Figure 7M:
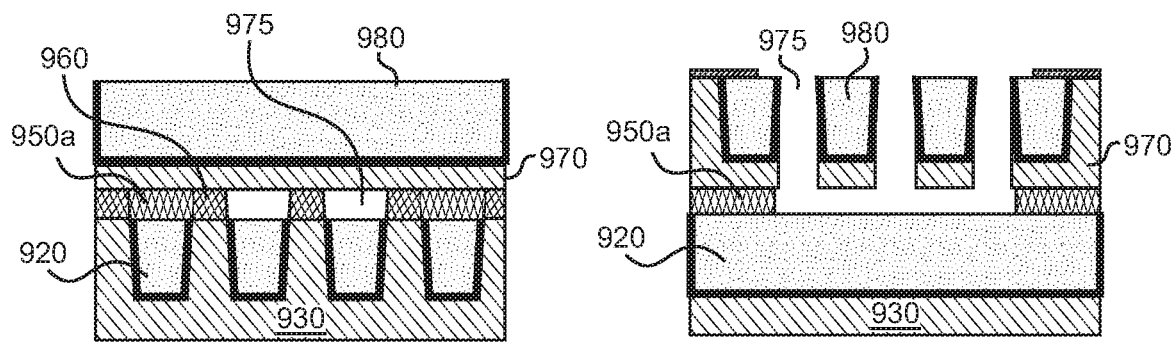
Figure 7N:
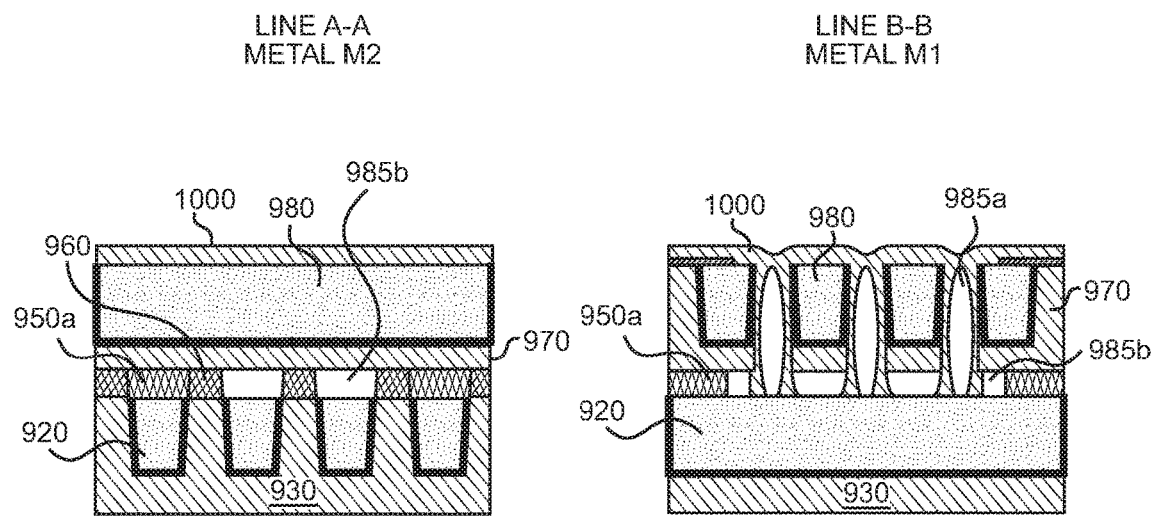

FIGS. 7A-7N show different cross-sectional views along line A-A and line B-B of FIG. 7. For example, FIGS. 7A-7N show a cross sectional view along the upper metal line 980 along A-A of FIG. 7 (on the left side); whereas, FIGS. 7A-7N show a cross sectional the lower metal lines 920 along line B-B of FIG. 7 (on the right side). In FIG. 7A, the structure 900 includes a dielectric material 930 and a capping material 960, on the dielectric material 930. In embodiments, the capping material 960 can be a nitride material, deposited using conventional deposition processes, e.g., CVD.

In FIG. 7B, trenches 906 are formed through the capping material 960 and into the dielectric material 930 using conventional lithography and etching processes as already described herein. In FIG. 7C, a metal material fills the trenches 906 to form the lower metal lines 920. In embodiments, the lower metal lines 920 can include a barrier liner and any metal fill (e.g., copper fill or ruthenium fill) which is deposited by conventional deposition processes followed by a planarization process, e.g., a CMP process.

In FIG. 7D, the metal material is recessed to below the capping material 960, resulting in a recess 910. In embodiments, the recess 910 can be formed by a conventional etching process, with a chemistry selective to the metal material 920.

In FIG. 7E, the recesses 910 are filled with a capping material 950, e.g., SiN or other material which can be conformally deposited. In FIG. 7F, the capping material 950 is planarized or etched back, resulting in discrete islands 950a over the metal wiring lines 920.

In FIG. 7G, an interlevel dielectric layer 970 and a masking material 925 are formed over the capping material 960 and the capping material 950a (i.e., the discrete islands 950a). In embodiments, the interlevel dielectric layer 970 and masking material 925 can be deposited using conventional deposition processes, e.g., CVD processes. The interlevel dielectric layer 970 can be an oxide material; whereas, the masking material 925 can be a nitride material or other hardmask material.

In FIG. 7H, the interlevel dielectric layer 970 is subjected to an etching process in order to form trenches 970a orthogonal to the lower metal lines 920, along line A-A of FIG. 7. The trenches 970a are then filled with metal material (e.g., copper material or ruthenium material) as shown in FIG. 7I to form the upper metal line 980. This metal material can include a barrier and liner and any metal fill (e.g., copper fill or ruthenium fill), which is deposited by conventional deposition processes, followed by a planarization process, e.g., a CMP process. In this way, the wiring structures, e.g., upper metal wiring lines 980 are formed orthogonal to the lower metal wiring lines 920.

In FIG. 7J, an optional capping material 935 can be deposited over the upper metal line 980. In embodiments, the capping material 935 can be, e.g., SiN, SiOC, or SiON. In FIG. 7K, the structure undergoes a patterning process using a conventional lithography stack 940 patterned by conventional lithography processes, e.g., exposure to energy (light), to form an opening exposing the underlying metal lines 980. Following the lithography process, in FIG. 7L, trenches 945 are formed on sides of the upper metal material 980 as shown along lines B-B. In embodiments, the trenches 945 will stop on the capping material 950a, which will act as an etch stop.

In FIG. 7M, an additional etching process is performed to remove selected ones of the capping material 950a (i.e., the discrete islands 950a), thereby forming a cavity 975 (which includes the trenches 945) under each of the selected upper metal wiring lines 980. In FIG. 7N, material 1000 is deposited in the trenches to form air gaps 985a and 985b. In embodiments, the material 1000 is deposited by a conformal deposition process which will pinch off, forming the air gaps 985a and 985b. As shown in FIG. 7N, along line B-B, the material 1000 will extend to the underlying metal wiring line 920, thus forming discrete air gaps. This is possible due to the spacing between the upper metal lines 980, e.g., width of the trenches between the upper metal lines 980. In embodiments, the material 1000 can be SiN or SiO$_2$ deposited by a CVD process or a LVD process. The processes can then continue to a next module, e.g., upper layers with air gap structures as described herein.

Example 2

Figure 8:
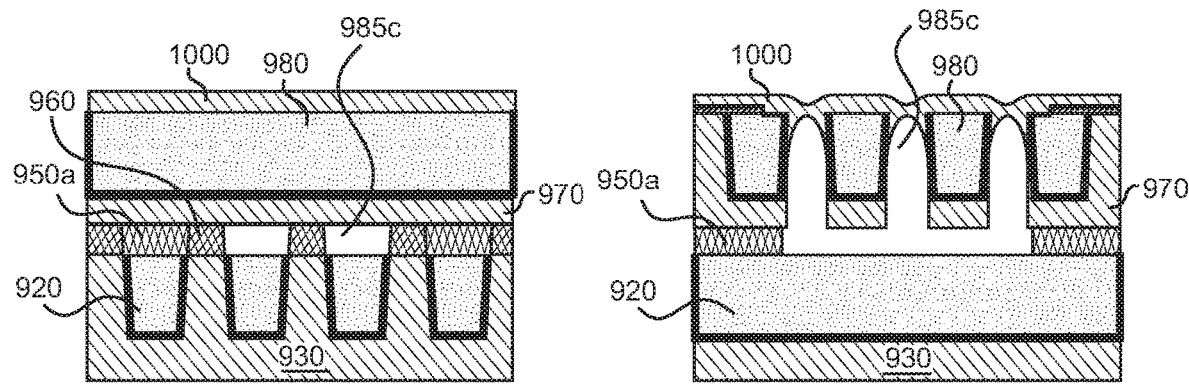
FIG. 8 shows cross-sectional views along line A-A and line B-B of FIG. 7 in accordance with additional aspects of the present disclosure.

FIG. 8 shows cross-sectional views along line A-A and line B-B of FIG. 7, depicting another embodiment in accordance with aspects of the present disclosure. In FIG. 8, a single air gap structure 985c is formed under selected upper metal wiring lines 980. In this representation, the single air gap structure 985 is formed by a pinch-off process of material 1000 at a top portion of the trenches 945. That is, in contrast to that shown in FIG. 7N, for example, the material 1000 will not deposit in the lower portion of the trenches 945 or on the selected lower metal wiring lines 920. This pinch-off process shown in FIG. 8 is due to the critical dimension (e.g., smaller width profile) of the trenches 945, compared to the trenches shown in the previous embodiment.

Example 3

Figure 9:
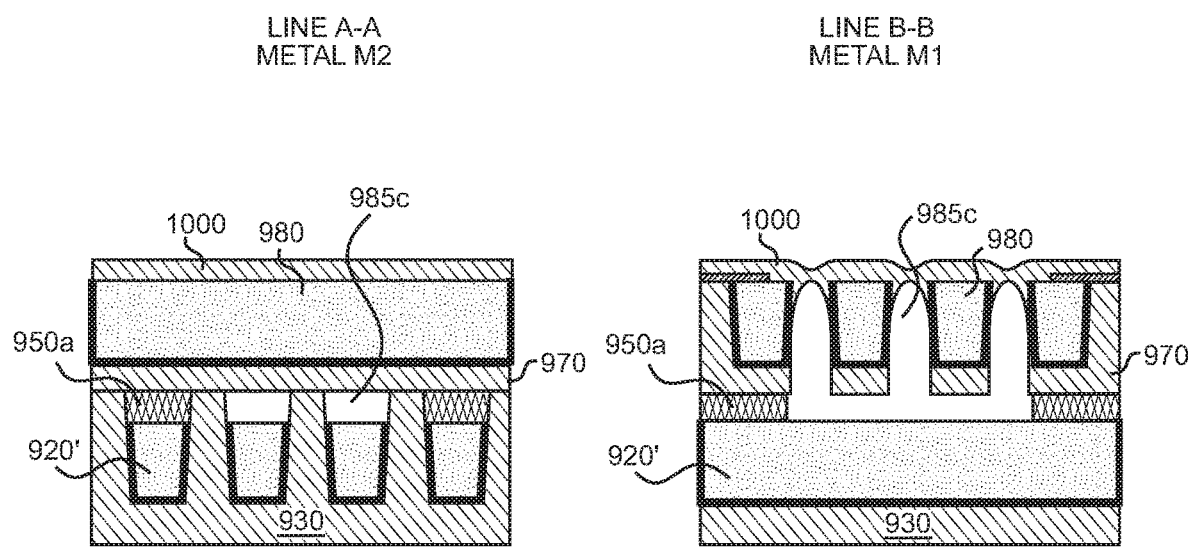
FIG. 9 shows cross-sectional views along line A-A and line B-B of FIG. 7 in accordance with additional aspects of the present disclosure.

FIG. 9 shows cross-sectional views along line A-A and line B-B of FIG. 7, depicting another embodiment in accordance with aspects of the present disclosure. In FIG. 9, for example, the capping material 960 shown in FIGS. 7A-7N can be eliminated due to different material of the dielectric material 930. For example, if the lower metal wiring lines 920' are a local interconnect (e.g., with W metal), then the dielectric material 930 could be a non low-k film. In this situation, the capping material 960 is no longer needed. Therefore, the capping material 960 can be eliminated using different materials for the dielectric material 920 and/or the lower metal wiring lines 920'. Following deposition of the lower metal wiring lines 920', the material can be recessed as shown, e.g., in FIG. 7D. The remaining steps are similar to that shown in the sequence of FIGS. 7D-7M and 8. It should be understood that although a single air gap structure 985c is shown in FIG. 9 (similar to that shown in FIG. 8), multiple air gap structures are also contemplated as shown in FIG. 7N (with the difference being the critical dimension of the trenches formed on sides of the upper wiring lines).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a lower metal line within dielectric material;
   forming a first material above the lower metal line;
   forming an upper dielectric material over the first material;
   forming a plurality of upper metal lines over the upper dielectric material;
   etching the upper dielectric material to expose the first material;
   removing the first material to form a first airgap above the lower metal line; and
   forming another dielectric material between each of the plurality of upper metal lines to seal the first airgap,
   wherein the first airgap is formed partially within a recess of the lower metal line.

2. The method of claim 1, further comprising forming a recess in the lower metal line and filling the recess with the first material above the lower metal.

3. The method of claim 1, further comprising forming a recess in the lower metal line and depositing the first material in the recess.

4. The method of claim 3, further comprising forming material on the side of the first material, which has a selective etchability to the first material.

5. The method of claim 4, wherein the material protects the dielectric material during the forming of the first airgap.

6. The method of claim 3, further comprising forming a second airgap by a pinch off process during the deposition of the another dielectric material.

7. The method of claim 1, wherein the lower metal line and the plurality of upper metal lines are composed of one of copper and ruthenium.

8. The method of claim 1, wherein the upper dielectric material is in direct contact with sidewalls of the plurality of upper metal lines.

9. The method of claim 8, wherein the upper dielectric material is formed to seal sidewalls and a top surface of the first airgap.

10. A method, comprising:
forming a lower metal line within dielectric material;
forming a first material above the lower metal line;
forming an upper dielectric material over the first material;
forming a plurality of upper metal lines over the upper dielectric material;
etching the upper dielectric material to expose the first material;
removing the first material to form a first airgap above the lower metal line; and
forming another dielectric material between each of the plurality of upper metal lines to seal the first airgap,
wherein the upper dielectric material is in direct contact with sidewalls of the plurality of upper metal lines,
the upper dielectric material is formed to seal sidewalls and a top surface of the first airgap, and
the first airgap is formed between sidewalls of a capping material which is directly above a top surface of the dielectric material and below a bottom surface of the plurality of upper metal lines.

11. A method, comprising:
forming a lower metal line within dielectric material;
forming a first material above the lower metal line;
forming an upper dielectric material over the first material;
forming a plurality of upper metal lines over the upper dielectric material;
etching the upper dielectric material to expose the first material;
removing the first material to form a first airgap above the lower metal line; and
forming another dielectric material between each of the plurality of upper metal lines to seal the first airgap;
forming a capping material on a top surface of the dielectric material;
forming a first set of trenches through the capping material and into the dielectric material;
filling the first set of trenches with a metal material; and
recessing the metal material to below the capping material to form a recess.

12. The method of claim 11, further comprising:
filling the recess with another capping material;
etching back the another capping material to form discrete islands;
forming an interlevel dielectric layer over the capping material; and
forming a masking material over the interlevel dielectric layer.

13. The method of claim 12, further comprising:
etching the interlevel dielectric layer to form a second set of trenches;
filling the second set of trenches with another metal material; and
forming another capping material over the another metal material.

14. The method of claim 13, further comprising:
forming an opening in the another metal material by a patterning process;
forming a third set of trenches on sidewalls of the another metal material; and
etching the another capping material to remove the discrete islands.

15. The method of claim 14, further comprising depositing a material in the third set of trenches to form a first air gap and a second air gap,
wherein the material comprises silicon nitride, extends to the metal material, and is deposited by a conformal deposition process which pinches off to form the first air gap and the second air gap.

16. The method of claim 14, further comprising depositing a material in the third set of trenches to form a single air gap,
wherein the single air gap is formed under the metal material by a pinch-off process of the material at a top portion of the third set of trenches.

* * * * *